US012571125B2

(12) United States Patent
Takezawa et al.

(10) Patent No.: US 12,571,125 B2
(45) Date of Patent: Mar. 10, 2026

(54) METHOD FOR FORMING POLYCRYSTALLINE SILICON FILM

(71) Applicant: Tokyo Electron Limited, Tokyo (JP)

(72) Inventors: Yoshihiro Takezawa, Yamanashi (JP); Tatsuya Miyahara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 310 days.

(21) Appl. No.: 18/051,061

(22) Filed: Oct. 31, 2022

(65) Prior Publication Data

US 2023/0141501 A1 May 11, 2023

(30) Foreign Application Priority Data

Nov. 11, 2021 (JP) ................................. 2021-184177

(51) Int. Cl.
*C30B 25/02* (2006.01)
*C30B 29/06* (2006.01)
*C30B 1/02* (2006.01)

(52) U.S. Cl.
CPC .............. *C30B 25/02* (2013.01); *C30B 29/06* (2013.01); *C30B 1/023* (2013.01)

(58) Field of Classification Search
CPC ... C23C 16/24; C23C 16/45578; C23C 16/56; C30B 1/023; C30B 25/02; C30B 29/06
See application file for complete search history.

(56) References Cited

U.S. PATENT DOCUMENTS

| 5,913,119 | A | * | 6/1999 | Lin | ...................... H10B 12/318 |
| | | | | | 257/E21.018 |
| 2015/0079756 | A1 | * | 3/2015 | Yamawaki | ........... H10B 12/033 |
| | | | | | 438/701 |
| 2018/0040475 | A1 | * | 2/2018 | Miyakura | ............... C23C 16/56 |

FOREIGN PATENT DOCUMENTS

JP 2015-115435 6/2015

* cited by examiner

*Primary Examiner* — Hua Qi
(74) *Attorney, Agent, or Firm* — IPUSA, PLLC

(57) ABSTRACT

A method for forming a polycrystalline silicon film includes forming a first amorphous silicon film having an island shape on a substrate. The method includes forming a second amorphous silicon film, the second amorphous silicon film covering the first amorphous silicon film. The method includes forming a third amorphous silicon film on the second amorphous silicon film. The method includes heating the substrate to a first temperature at which the first amorphous silicon film crystallizes more easily than the second amorphous silicon film. The first amorphous silicon film crystallizes at a temperature lower than that of the second amorphous silicon film.

5 Claims, 4 Drawing Sheets

METHOD FOR FORMING POLYCRYSTALLINE SILICON FILM

CROSS-REFERENCE TO RELATED APPLICATIONS

This patent application claims priority to Japanese Patent Application No. 2021-184177, filed Nov. 11, 2021, the contents of which are incorporated herein by reference in their entirety.

TECHNICAL FIELD

The present disclosure relates to a method for forming a polycrystalline silicon film.

BACKGROUND

A technique is known in which an amorphous silicon film, which is doped with impurities that suppress the progression of crystallization, as well as a non-doped amorphous silicon film, are laminated in this order so as to be situated on and above an insulating film, and then the laminated amorphous silicon films are crystallized (see, for example, Patent Document 1).

RELATED-ART DOCUMENT

Patent Document

[Patent Document 1] Japanese Unexamined Patent Application Publication No. 2015-115435

SUMMARY

A method for forming a polycrystalline silicon film includes forming a first amorphous silicon film having an island shape on a substrate. The method includes forming a second amorphous silicon film, the second amorphous silicon film covering the first amorphous silicon film. The method includes forming a third amorphous silicon film on the second amorphous silicon film. The method includes heating the substrate to a first temperature at which the first amorphous silicon film crystallizes more easily than the second amorphous silicon film. The first amorphous silicon film crystallizes at a temperature lower than that the second amorphous silicon film.

DETAILED DESCRIPTION

Figure 1:
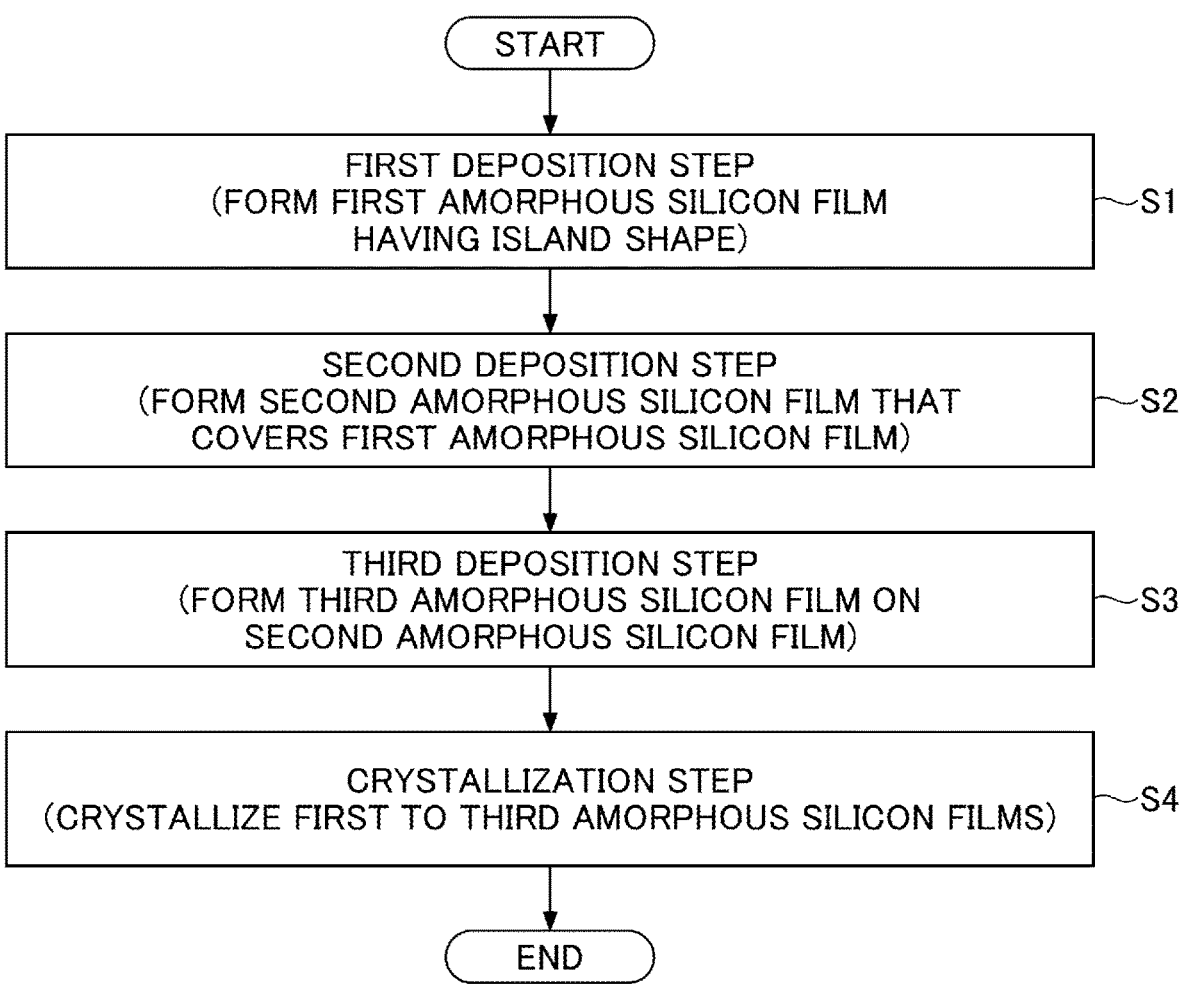
FIG. 1 is a flowchart illustrating a method for forming a polycrystalline silicon film according to an embodiment.

Non-limiting embodiments of the present disclosure will be described below with reference to the drawings. In the drawings, the same or corresponding members or components are denoted by the same or corresponding numerals, and accordingly, duplicate description will be omitted.

Method for Forming Polycrystalline Silicon Film

A method for forming a polycrystalline silicon film according to an embodiment will be described with reference to FIGS. 1 to 5. In the following description, a case where the polycrystalline silicon film is formed on an insulating film that is disposed in a substrate will be described as an example.

As illustrated in FIG. 1, the method for forming a polycrystalline silicon film according to the embodiment includes performing a first deposition step S1, a second deposition step S2, a third deposition step S3, and a crystallization step S4 in this order.

First Deposition Step S1

Figure 2:
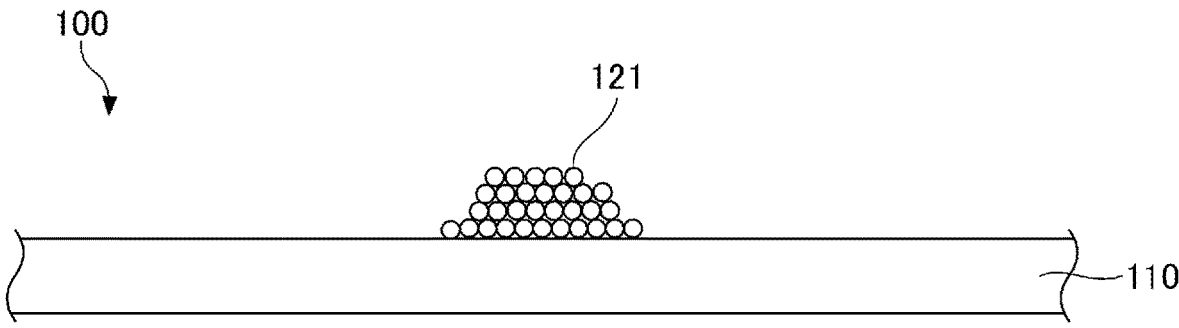
FIG. 2 is a cross-sectional view (1) of the polycrystalline silicon film according to the embodiment, the cross-sectional view being describing for the method for forming the polycrystalline silicon film.

As illustrated in FIG. 2, the first deposition step S1 includes forming a first amorphous silicon film 121 having an island shape, on an insulating film 110 that is formed on the surface of a substrate 100. The first amorphous silicon film 121 is a film that crystallizes at a temperature lower than that of a second amorphous silicon film 122 described below. The first amorphous silicon film 121 is formed by supplying a first silicon-containing gas onto the substrate 100. As the first silicon-containing gas, a monosilane ($SiH_4$)-containing gas can be used suitably. The first deposition step S1 may be performed in a processing chamber that is maintained at a pressure greater than a pressure used in the second deposition step S2. With this approach, a thermal decomposition temperature of the first silicon-containing gas can be reduced. For example, in a generally used range of pressures (for example, greater than or equal to 1 Pa and less than or equal to 1000 Pa), a thermal decomposition temperature of monosilane is approximately 450° C. to 530° C., and a thermal decomposition temperature of disilane, which is an example of higher order silane described below, is appropriately 350° C. to 420° C. In such a case, when the first deposition step S1 is performed in the processing chamber maintained at the same pressure as a pressure used in the second deposition step S2, a deposition temperature used in the first film forming process S1 is set to be greater than a deposition temperature in the second deposition step S2. In contrast, when the first deposition step S1 is performed in the processing chamber that is maintained at the pressure greater than the pressure used in the second deposition step S2, the thermal decomposition temperature of the monosilane can be reduced. For example, when the first deposition step S1 is performed in the processing chamber that is maintained at a pressure in the range of greater than or equal to 1.3 kPa and less than or equal to 13 kPa (i.e., greater than or equal to 10 Torr and less than or equal to 100 Torr), monosilane can be thermally decomposed at a temperature in the range of greater than or equal to 350° C. and less than or equal to 420° C. As a result, the first deposition step S1 and the second deposition step S2 can be performed at the same temperature. A suitable process condition used in the first deposition step S1 is as follows.

First Silicon-Containing Gas: Monosilane

Substrate temperature: greater than or equal to 350° C. and less than or equal to 420° C.
Pressure of processing chamber: greater than or equal to 1.3 kPa and less than or equal to 13 kPa

Second Deposition Step S2

Figure 3:
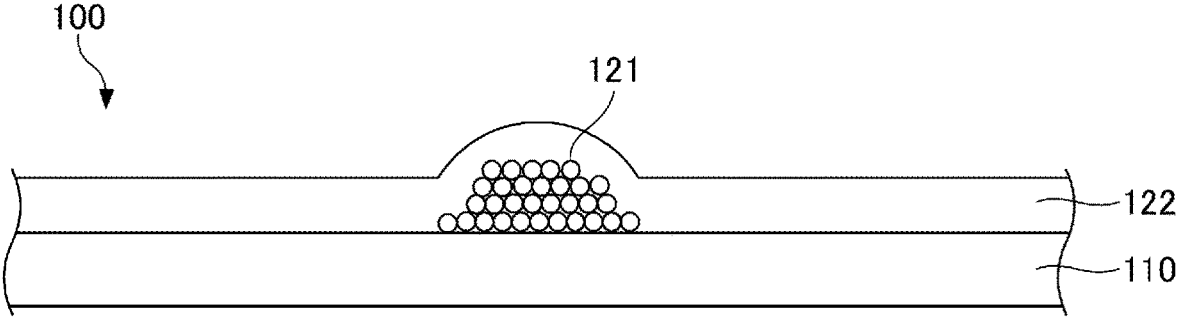
FIG. 3 is a cross-sectional view (2) of the polycrystalline silicon film according to the embodiment, the cross-sectional view being describing for the method for forming the polycrystalline silicon film.

As illustrated in FIG. 3, the second deposition step S2 includes forming a second amorphous silicon film 122 that covers the first amorphous silicon film 121. The second amorphous silicon film 122 is formed by supplying a second silicon-containing gas onto the substrate 100. As the second silicon-containing gas, a high order silane gas that contains two or more silicon (Si) atoms in one molecule can be suitably used. The high order silane gas has an increased number of silicon atoms in one molecule, and allows a given film to be formed at a low temperature. With this approach, with use of the high order silane gas, the second amorphous silicon film 122 is formed such that the second amorphous silicon film 122 covers the insulating film 110 and the first amorphous silicon film 121. An example of the high order silane gas includes disilane ($Si_2H_6$), trisilane ($Si_3H_8$), tetrasilane ($Si_4H_{10}$), or a mixture gas of two or more of the gases described above. A suitable process condition used in the second deposition step S2 is as follows.

Second Silicon-Containing Gas: Disilane

Substrate temperature: greater than or equal to 350° C. and less than or equal to 420° C.
Pressure of processing chamber: greater than or equal to 1 Pa and less than or equal to 1000 Pa

Third Deposition Step S3

Figure 4:
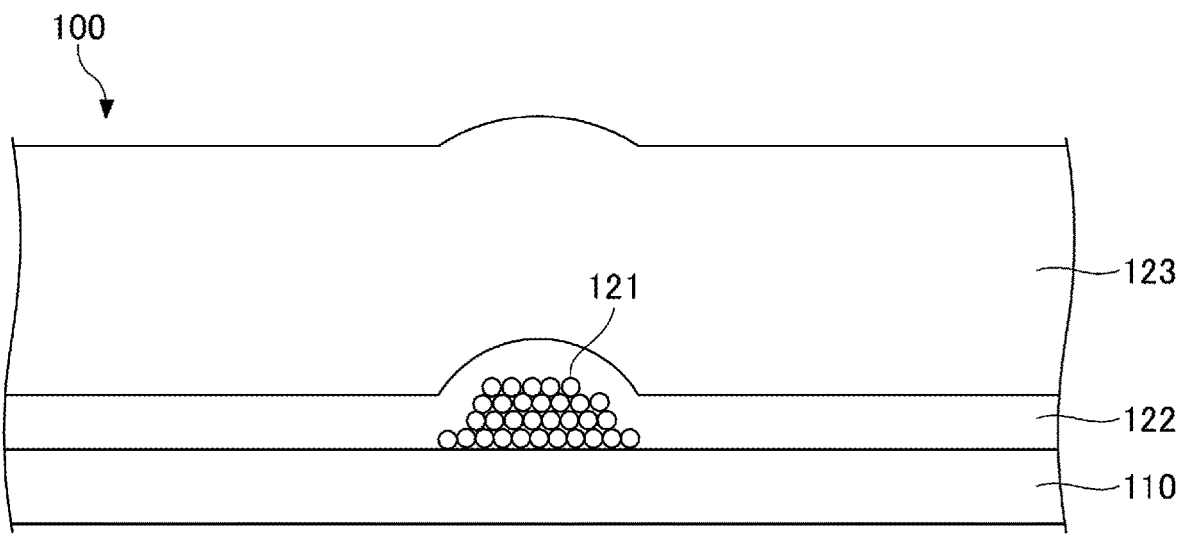
FIG. 4 is a cross-sectional view (3) of the polycrystalline silicon film according to the embodiment, the cross-sectional view being describing for the method for forming the polycrystalline silicon film.

As illustrated in FIG. 4, the third deposition step S3 includes forming a third amorphous silicon film 123 on the second amorphous silicon film 122. The third amorphous silicon film 123 is formed by supplying a third silicon-containing gas onto the substrate 100. As the third silicon-containing gas, for example, monosilane, a high order silane gas, a halogen-containing silicon gas, or a mixed gas of two or more of the gases described above can be used. Examples of the halogen-containing silicon gas can include (i) a fluorine-containing silicon gas such as $SiF_4$, $SiHF_3$, $SiH_2F_2$, or $SiH_3F$, (ii) a chlorine-containing silicon gas such as $SiCl_4$, $SiHCl_3$, $SiH_2Cl_2$ (DCS), or $SiH_3Cl$, and (iii) a bromine-containing gas such as $SiBr_4$, $SiHBr_3$, $SiH_2Br_2$, or $SiH_3Br$. As the third silicon-containing gas, monosilane can be suitably used from the viewpoint of an increased deposition rate and low costs. The third deposition step S3 may be performed at the same temperature as the temperature used in the second deposition step S2, or may be performed at a temperature different from the temperature used in the second deposition step S2. A suitable process condition used in the third deposition step S3 is as follows.

Third Silicon-Containing Gas: Monosilane

Substrate temperature: greater than or equal to 450° C. and less than or equal to 530° C.

Pressure of processing chamber: greater than or equal to 1 Pa and less than or equal to 1000 Pa

Crystallization Step S4

Figure 5:
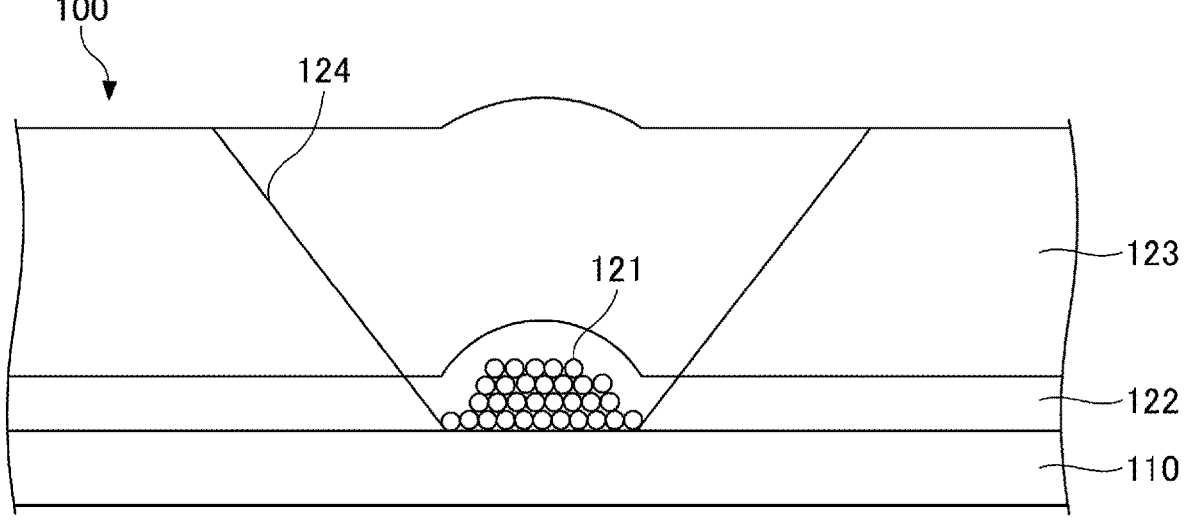
FIG. 5 is a cross-sectional view (4) of the polycrystalline silicon film according to the embodiment, the cross-sectional view being described for the method for forming the polycrystalline silicon film.

The crystallization step S4 includes heating the substrate 100 to a first temperature to crystallize the first amorphous silicon film 121, the second amorphous silicon film 122, and the third amorphous silicon film 123, thereby forming a polycrystalline silicon film. The first temperature is a temperature at which the first amorphous silicon film 121 crystallizes more easily than the second amorphous silicon film 122. In this case, as illustrated in FIG. 5, crystallization of the first amorphous silicon film 121, the second amorphous silicon film 122, and the third amorphous silicon film 123 progresses by nucleating the first amorphous silicon film 121 having the island shape. As a result, the polycrystalline silicon film having a large grain size can be formed. The numeral 124 in FIG. 5 schematically indicates a crystal grain boundary between adjacent mono-crystalline regions. For example, when monosilane is used in the first deposition step S1 and disilane gas is used in the second deposition step S2, the first temperature may be greater than or equal to 550° C. and less than or equal to 600° C. The crystallizing step S4 is performed under an inert gas atmosphere such as a nitrogen atmosphere or an argon atmosphere, or under a reducing gas atmosphere such as a hydrogen atmosphere.

In the above method for forming a polycrystalline silicon film according to the embodiment, the first amorphous silicon film 121 having an island shape is first formed on the substrate 100. Next, the second amorphous silicon film 122 that covers the first amorphous silicon film 121 is formed. Then, the third amorphous silicon film 123 is formed on the second amorphous silicon film 122. Subsequently, the substrate 100 is heated to a first temperature. In this case, the first amorphous silicon film 121 is a film that crystallizes at a temperature lower than that of the second amorphous silicon film 122, and the first temperature is a temperature at which the first amorphous silicon film 121 crystallizes more easily than the second amorphous silicon film 122. Thus, crystallization of the first amorphous silicon film 121, the second amorphous silicon film 122, and the third amorphous silicon film 123 progresses by nucleating the first amorphous silicon film 121 having the island shape. As a result, the polycrystalline silicon film having a large grain size can be formed.

Processing Apparatus

An example of a processing apparatus that performs a method for forming the polycrystalline silicon film according to the embodiment will be described with reference to FIG. 6. A processing apparatus 1 is a batch-type apparatus that performs a process in which substrates are processed at the same time. Each substrate may be, for example, a semiconductor wafer (hereinafter simply referred to as a "wafer W").

The processing apparatus 1 includes a processing chamber 10, a gas supply 30, an exhaust device 40, a heater 50, a controller 80, and the like.

An interior of the processing chamber 10 can be depressurized, and the processing chamber 10 accommodates wafers W. The processing chamber 10 includes a cylindrical inner tube 11 having a lower end that is open and having a ceiling, and also includes a cylindrical outer tube 12 that covers the outer side of the inner tube 11. The lower end of the outer tube 12 is open and the outer tube 12 has a ceiling.

The inner tube 11 and the outer tube 12 are each formed of a heat-resistant material such as quartz, and are coaxially arranged to form a double tube structure.

The ceiling of the inner tube 11 is flat, for example. An accommodation portion 13 that accommodates a gas nozzle along the longitudinal direction (vertical direction) of the inner tube 11 is formed at one side of the inner tube 11. A portion of the sidewall of the inner tube 11 protrudes outward to form a protruding portion 14, and the inside of the protruding portion 14 is formed as the accommodation portion 13.

A rectangular opening 15 is formed in the sidewall of the inner tube 11 on the other side of the inner tube 11 along the longitudinal direction (vertical direction) of the inner tube 11 so as to face the accommodation portion 13.

The opening 15 is a gas exhaust port formed so as to be capable to exhaust the gas in the inner tube 11. The opening 15 has the same as a length of a wafer boat 16, or extends vertically, i.e., both upwards and downwards, to be longer than the length of the wafer boat 16.

A lower end of the processing chamber 10 is supported by a cylindrical manifold 17 made of, for example, stainless steel. A flange 18 is formed on an upper end of the manifold 17, and a lower end of the outer tube 12 is provided to be supported on the flange 18. A sealing member 19, such as an O-ring, is interposed between the flange 18 and the lower end of the outer tube 12 so that an interior of the outer tube 12 is hermetically sealed.

An annular support 20 is provided at an inner wall of the upper portion of the manifold 17, and the lower end of the inner tube 11 is provided to be supported on the support 20. A cover 21 is hermetically attached to an opening at the lower end of the manifold 17 through the sealing member 22 such as an O-ring, so as to hermetically close the opening at the lower end of the processing chamber 10, that is, the opening of the manifold 17. The cover 21 is made of stainless steel, for example.

A rotation shaft 24, which rotatably supports the wafer boat 16 through a magnetic fluid sealing portion 23, is provided at the central portion of the cover 21 to pass through the cover 21. A lower portion of the rotation shaft 24 is rotatably supported by an arm 25A of an elevation mechanism 25 that includes a boat elevator.

A rotation plate 26 is provided at an upper end of the rotation shaft 24, and the wafer boat 16 that holds the wafers W is provided above the rotation plate 26, via a heated platform 27 made of quartz. With this arrangement, the cover 21 and the wafer boat 16 are integrally moved up and down by raising and lowering the elevation mechanism 25. Thus, the wafer boat 16 can be inserted into or removed from the processing chamber 10. The wafer boat 16 can be accommodated by the processing chamber 10 and substantially horizontally holds a plurality of (for example, 50 to 150) wafers W, such that the wafers are spaced apart from one another when viewed in the vertical direction.

The gas supply 30 supplies, into the inner tube 11, process gas used in each of the first deposition step S1, the second deposition step S2, and the third deposition step S3. The process gas includes a first silicon-containing gas, a second silicon-containing gas, a third silicon-containing gas, and purge gas, and the like. The gas supply 30 includes a gas nozzle 31.

The gas nozzle 31 is made of, for example, quartz, and is provided in the inner tube 11 along a longitudinal direction of the inner tube 11. Also, a base end of the gas nozzle 31 is bent in an L-shape, and is supported so as to pass through the manifold 17. Gas holes 32 are formed at the gas nozzle 31 along the longitudinal direction of the gas nozzle, and the process gas is horizontally discharged via the gas holes 32. The gas holes 32 are arranged at the same intervals as intervals of the wafers W that are supported by the wafer boat 16, for example. The process gas of which a flow rate is controlled is introduced into the gas nozzle 31.

Figure 6:
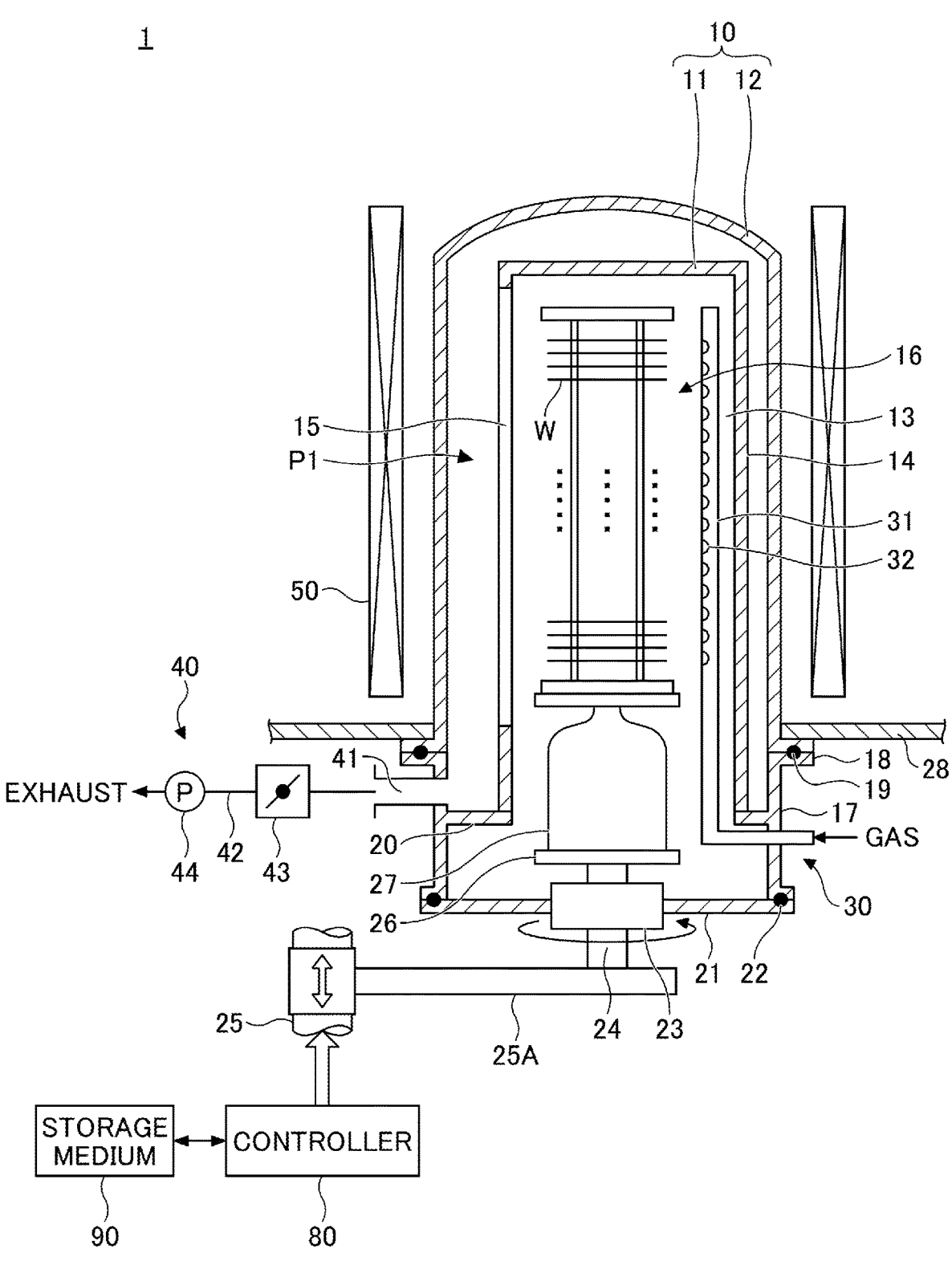
FIG. 6 is a schematic diagram of an example of a processing apparatus that performs the method for forming the polycrystalline silicon film according to the embodiment.

Although FIG. 6 illustrates a case where the gas supply 30 includes one gas nozzle 31, the gas supply 30 is not limited to the manner described above. For example, the gas supply 30 may include multiple gas nozzles. In this case, the first silicon-containing gas, the second silicon-containing gas, the third silicon-containing gas, and the purge gas may be supplied from the same gas nozzle into the inner tube 11, or may be respectively supplied from different gas nozzles into the inner tube 11.

The exhaust device 40 exhausts the gas discharged from the interior of the inner tube 11, through the opening 15. Also, the exhaust device 40 exhausts the gas discharged from a gas outlet 41, through a space P1, which is between the inner tube 11 and the outer tube 12. The gas outlet 41 is formed at the sidewall of the upper portion of the manifold 17 so as to be situated above the support 20. An exhaust passage 42 is connected to the gas outlet 41. A pressure regulating valve 43 and a vacuum pump 44 are separately provided in the exhaust passage 42 to allow the gas in the processing chamber 10 to be exhausted.

The heater 50 is provided around the outer tube 12. The heater 50 is provided, for example, above the base plate 28. The heater 50 has a cylindrical shape so as to surround the outer tube 12. The heater 50 includes, for example, a heating element, and heats the wafers W in the processing chamber 10.

The controller 80 controls the operation of each component of the processing apparatus 1. The controller 80 may be implemented, for example, by a computer. A program used for a computer that performs the operation of each component of the processing apparatus 1 is stored in a storage medium 90. The storage medium 90 may be, for example, a flexible disk, a compact disk, a hard disk, a flash memory, a digital versatile disc (DVD), or the like.

Operation of Processing Apparatus

A case where the processing apparatus 1 performs the method for forming a polycrystalline silicon film according to the embodiment will be described below. The controller 80 controls the operation of each component of the processing apparatus 1 to perform the method as follows.

First, the wafer boat 16 on which the wafers W are mounted is transferred to the processing chamber 10. Next, the opening at the lower end of the manifold 17 is closed by the cover 21, and thus the interior of the processing chamber 10 forms a sealed space.

Then, the first deposition step S1 is performed. In the first deposition step S1, the interior of the processing chamber 10 is vacuum-evacuated to be maintained at a first process pressure, and power supplied to the heater 50 is adjusted to increase the temperature of each wafer to a first process temperature. The first process pressure is set to, for example, be greater than or equal to 1.3 kPa and less than or equal to 13 kPa. The first process temperature is set to, for example, be greater than or equal to 350° C. and less than or equal to 420° C. After the interior of the processing chamber 10 is stabilized at the first process pressure and the temperature of each wafer is stabilized at the first process temperature, monosilane as a first silicon-containing gas is supplied into the processing chamber 10, while the controller 80 rotates the wafer boat 16. With this approach, the first amorphous silicon film 121 having an island shape is formed on each wafer W. After the first amorphous silicon film 121 having the island shape is formed on each wafer W, supplying of the first silicon-containing gas into the processing chamber 10 is stopped. The rotation of the wafer boat 16 is continued.

Then, the second deposition step S2 is performed. In the second deposition step S2, the pressure of the interior of the processing chamber 10 is changed from the first process pressure to a second process pressure, and the temperature of each wafer is adjusted to the second process temperature by adjusting the power supplied to the heater 50. The second process pressure is set to, for example, be greater than or equal to 1 Pa and less than or equal to 1000 Pa. The second process temperature is set to be the same as the first process temperature, for example. With this approach, it is not necessary to change the temperature used in the second deposition step S2, thereby increasing productivity. However, the second process temperature may be different from the first process temperature. After the interior of the processing chamber 10 is stabilized at the second process pressure and the temperature of each wafer is stabilized at the second process temperature, disilane as a second silicon-containing gas is supplied into the processing chamber 10, in a state where the rotation of the wafer boat 16 is continued. With this approach, the second amorphous silicon film 122 that covers the first amorphous silicon film 121 is formed. After the first amorphous silicon film 121 is entirely covered with the second amorphous silicon film 122, supplying of the second silicon-containing gas into the processing chamber 10 is stopped. The rotation of the wafer boat 16 is continued.

Then, the third deposition step S3 is performed. In the third deposition step S3, the pressure of the interior of the processing chamber 10 is changed from the second process pressure to a third process pressure, and the temperature of each wafer is adjusted to a third process temperature by adjusting the power supplied to the heater 50. The third process pressure is set to, for example, be greater than or equal to 1 Pa and less than or equal to 1000 Pa. The third process temperature may be, for example, the same as the second process temperature, or may be different from the second process temperature. After the interior of the processing chamber 10 is stabilized at the third process pressure and the temperature of each wafer is stabilized at the third process temperature, monosilane as a third silicon-containing gas is supplied into the processing chamber 10, in a state where the rotation of the wafer boat 16 is continued. With this approach, the third amorphous silicon film 123 is formed on the second amorphous silicon film 122. The third amorphous silicon film 123 is formed to be thicker than, for example, the second amorphous silicon film 122. After the third amorphous silicon film 123 having a desired film thickness is formed, supplying of the third silicon-containing gas into the processing chamber 10 is stopped. The rotation of the wafer boat 16 is continued.

Subsequently, the crystallization step S4 is performed. In the crystallization step S4, the interior of the processing chamber 10 is subject to an inert gas atmosphere, and the temperature of each wafer is adjusted to a fourth process temperature by adjusting the power supplied to the heater 50. The inert gas atmosphere may be, for example, a nitrogen atmosphere or an argon atmosphere. Instead of the inert gas atmosphere, a reducing gas atmosphere such as a hydrogen atmosphere may be used. The fourth process temperature is set to a temperature at which the first amorphous silicon film 121 crystallizes more easily than the second amorphous silicon film 122. For example, the fourth process temperature is greater than or equal to 550° C. and less than or equal to 600° C. With this approach, crystallization of the first amorphous silicon film 121, the second amorphous silicon film 122, and the third amorphous silicon film 123 progresses by nucleating the first amorphous silicon film 121 having the island shape. As a result, the polycrystalline silicon film having a large grain size can be formed.

After the polycrystalline silicon film is formed, the wafers W are transferred out of the processing chamber 10 in reverse order from the order in which the wafers W are transferred into the processing chamber 10.

While certain embodiments are described using the method for forming a polycrystalline silicon film, these embodiments are presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the scope of the disclosures. The accompanying claims and their equivalents are intended to cover such forms or modifications as would fall within the scope of the disclosures.

The above embodiments are described using a case where the processing apparatus is a batch-type apparatus in which wafers are processed at the same time. However, the present disclosure is not limited to the above type. For example, the processing apparatus may be a single-wafer processing apparatus in which wafers are processed one by one.

According to the embodiments of the present disclosure, a polycrystalline silicon film having a large grain size is capable of being formed.

What is claimed is:

1. A method for forming a polycrystalline silicon film comprising:

forming a first amorphous silicon film having an island shape on a substrate;

forming a second amorphous silicon film, the second amorphous silicon film covering the first amorphous silicon film;

forming a third amorphous silicon film on the second amorphous silicon film; and after forming the third amorphous silicon film, heating the substrate to a first temperature at which the first amorphous silicon film crystallizes more easily than the second amorphous silicon film, wherein the heating of the substrate at the first temperature is performed to progress crystallization of the first amorphous silicon film, the second amorphous silicon film, and the third amorphous silicon film, by nucleating the first amorphous silicon film having the island shape, wherein the forming of the first amorphous silicon film includes adjusting the substrate to a second temperature that is lower than the first temperature, supplying $SiH_4$ gas onto the substrate at the second temperature, at a first pressure, and stopping the supply of the $SiH_4$ gas after forming the first amorphous silicon film, wherein the supplying and stopping of the $SiH_4$ gas are controlled by a controller, wherein the forming of the second amorphous silicon film includes, after stopping the supply of the $SiH_4$ gas, maintaining the substrate including the first amorphous silicon film, at the second temperature, and supplying a high order silane gas onto the substrate maintained at the second temperature, at a second pressure that is less than the first pressure, and wherein the first pressure is greater than or equal to 1.3 kPa and less than or equal to 13 kPa.

2. The method according to claim 1, wherein the high order silane gas includes disilane, trisilane, tetrasilane, or a mixed gas of two or more among the disilane, the trisilane, and the tetrasilane.

3. The method according to claim 1, wherein the first temperature is greater than or equal to 550° C. and less than or equal to 600° C.

4. The method according to claim 1, wherein the forming of the first amorphous silicon film is performed in a processing chamber, the processing chamber being maintained at the first pressure.

5. The method according to claim 1, further comprising:

forming an insulating film on the substrate, wherein the first amorphous silicon film is formed on the insulating film.

* * * * *